United States Patent
Nguyen et al.

(10) Patent No.: US 9,479,865 B2
(45) Date of Patent: Oct. 25, 2016

(54) TRANSDUCER AMPLIFICATION CIRCUIT

(71) Applicant: Analog Devices Global, Hamilton (BM)

(72) Inventors: Khiem Quang Nguyen, Tewksbury, MA (US); Kim Spetzler Berthelsen, Koge (DK); Robert Adams, Acton, MA (US)

(73) Assignee: Analog Devices Global, Hamilton (BM)

( * ) Notice: Subject to any disclaimer, the term of this patent is extended or adjusted under 35 U.S.C. 154(b) by 262 days.

(21) Appl. No.: 14/231,192

(22) Filed: Mar. 31, 2014

(65) Prior Publication Data

US 2015/0281836 A1 Oct. 1, 2015

(51) Int. Cl.
*H04R 3/00* (2006.01)
*H03M 3/00* (2006.01)
(Continued)

(52) U.S. Cl.
CPC .............. *H04R 3/00* (2013.01); *G06F 3/0433* (2013.01); *H03F 1/32* (2013.01); *H03F 3/181* (2013.01); *H03F 3/38* (2013.01); *H03M 3/356* (2013.01); *H03F 2200/03* (2013.01)

(58) Field of Classification Search
CPC ............ H04R 3/00; H04R 3/04; H04R 3/06; H04R 3/08; H04R 3/10; H04R 19/04; H04R 19/005; H04R 2201/003; H04R 23/006; G06F 3/017; G06F 3/0433; G06F 3/043; H03F 1/32; H03F 3/181; H03F 3/38; H03F 2200/03; H03M 3/356; G01S 11/14
USPC ....... 381/120, 122, 111, 369, 174, 175, 190, 381/191; 330/10; 367/87, 95, 96, 99, 101; 379/433.03, 420.03; 340/686.6; 455/569.1, 569.2; 345/177
See application file for complete search history.

(56) References Cited

U.S. PATENT DOCUMENTS 5,073,777 A 12/1991 Fukuhara et al.
8,401,513 B2 * 3/2013 Langereis ............... G01S 15/06
367/118

(Continued)

FOREIGN PATENT DOCUMENTS

JP          06-232749       8/1994
WO         03/075603        9/2003

(Continued)

OTHER PUBLICATIONS

E. Janssen, A. van Roermund, Look-Ahead Based Sigma-Delta Modulation, Analog Circuits ans Signal Processing Springer Science + Business Media B.V. 2011.*

(Continued)

*Primary Examiner* — Vivian Chin
*Assistant Examiner* — Jason R Kurr
(74) *Attorney, Agent, or Firm* — Schwegman Lundberg & Woessner, P.A.

(57) ABSTRACT

A transducer amplification circuit may include a preamplifier circuit with a signal input receiving a transducer signal to provide an amplified transducer signal comprising audible frequency components and ultrasonic frequency components. The transducer amplification circuit may include a first sigma-delta modulator configured to sample and quantize the amplified transducer signal to generate a first digital transducer signal comprising a first quantization noise signal. The first sigma-delta modulator may include a first noise transfer function having a high pass response in at least a portion of an audible frequency range to push the quantization noise signal to ultrasonic frequencies. A second sigma-delta modulator is configured to sample and quantize the amplified transducer signal to generate a second digital transducer signal comprising a second quantization noise signal. The second sigma-delta modulator may include a second noise transfer function with a magnitude minimum placed at the ultrasonic frequencies.

20 Claims, 3 Drawing Sheets

(51) Int. Cl.
*H03F 3/181* (2006.01)
*H03F 3/38* (2006.01)
*H03F 1/32* (2006.01)
*G06F 3/043* (2006.01)

(56) References Cited

U.S. PATENT DOCUMENTS

| | | | |
|---|---|---|---|
| 8,502,717 | B2 | 8/2013 | Lin et al. |
| 8,787,113 | B2 * | 7/2014 | Turbahn ............. G06F 3/0346 367/118 |
| 8,855,187 | B2 * | 10/2014 | Reining ............. H03G 7/007 375/239 |
| 9,235,294 | B2 * | 1/2016 | Poulsen ............. G06F 3/043 |
| 2006/0274906 | A1 | 12/2006 | Jia et al. |
| 2010/0110273 | A1 | 5/2010 | Turbahn et al. |
| 2011/0026739 | A1 | 2/2011 | Thomsen et al. |
| 2011/0242305 | A1 | 10/2011 | Peterson et al. |

FOREIGN PATENT DOCUMENTS

| WO | 2013/087221 | | 6/2013 |
|---|---|---|---|
| WO | WO-2015150334 | A1 | 10/2015 |
| WO | WO-2015150334 | A4 | 10/2015 |

OTHER PUBLICATIONS

Liyuan Liu et al., "A 1-V 15-Bit Audio DS-ADC in 0.18 mm CMOS", IEEE Transactions on Circuits and Systems, Regular Papers, vol. 59, No. 5, May 2012, pp. 915-925.

Hong Chang et al., "Modeling of a Double-Sampling Switched-Capacitor Bandpass Delta-Sigma Modulator for Multi-Standard Applications", 9th IEEE International Conference on ASIC (ASICON 2011), Oct. 2011, pp. 465-468.

Udo Karthaus et al., "A 900 MHz, 3.6 Gb/s Bandpass DSM Receiver with 55.7 dB Two-Tone SFDR in 1 MHz Bandwidth", IEEE MTT-S International Microwave Symposium Digest MTT'09), Jun. 2009, pp. 1133-1136.

International Search Report and Written Opinion for International application No. PCT/EP2015/056910, report dated Jul. 28, 2015, 12 pages.

* cited by examiner

TRANSDUCER AMPLIFICATION CIRCUIT

FIELD OF THE INVENTION

The present invention relates to a transducer amplification circuit comprising a preamplifier circuit which comprises a signal input for receipt of a transducer signal and is operable to provide an amplified transducer signal comprising audible frequency components and ultrasonic frequency components. The transducer amplification circuit also comprises a first sigma-delta modulator configured to sample and quantize the amplified transducer signal to generate a first digital transducer signal comprising a first quantization noise signal. The first sigma-delta modulator comprises a first noise transfer function (NTF) having a high pass response in at least a portion of an audible frequency range to push the quantization noise signal to ultrasonic frequencies. A second sigma-delta modulator is configured to sample and quantize the amplified transducer signal to generate a second digital transducer signal comprising a second quantization noise signal. The second sigma-delta modulator comprises a second noise transfer function (NTF) with a magnitude minimum placed at the ultrasonic frequencies.

BACKGROUND OF THE INVENTION

Portable communication and computing devices such as smartphones, mobile phones, tablets etc. are compact devices which are powered from rechargeable battery sources. The compact dimensions and battery source both put severe constraints to the maximum acceptable dimensions and power consumption of transducers and transducer amplification circuit utilized in such portable devices. Hence, it is advantageous to integrate multiple functions in a single transducer unit such as a microphone. This type of integration may reduce power consumption of active circuitry, reduce space consumption and lower assembly costs of the portable communication or computing device in question. Portable communication devices furthermore often comprise a plurality of transducers such as microphones for voice and sound pick-up, recording and transmission which adds to the advantages of integrating multiple functions in a single transducer device.

Accordingly, a transducer amplification circuit that is connectable to a single broadband sound transducer and capable of amplifying and processing both audible sound signals and ultrasonic signals would be advantageous. It would further be advantageous if the transducer amplification circuit was capable of providing the audible sound signal and ultrasonic sound signal in digital formats in separate channels of a digital audio stream. This feature allow a microprocessor such as a Digital Signal Processor of the portable communication and computing devices to receive and separately process each of the sound signals for different functions in the portable communication and computing devices.

SUMMARY OF THE INVENTION

A first aspect of the invention relates to a transducer amplification circuit comprising a preamplifier circuit which comprises a signal input for receipt of a transducer signal and is operable to provide an amplified transducer signal comprising audible frequency components and ultrasonic frequency components. The transducer amplification circuit also comprises a first sigma-delta modulator configured to sample and quantize the amplified transducer signal to generate a first digital transducer signal comprising a first quantization noise signal. The first sigma-delta modulator comprises a first noise transfer function (NTF) having a high pass response in at least a portion of an audible frequency range to push the quantization noise signal to ultrasonic frequencies. A second sigma-delta modulator is configured to sample and quantize the amplified transducer signal to generate a second digital transducer signal comprising a second quantization noise signal. The second sigma-delta modulator comprises a second noise transfer function (NTF) with a magnitude minimum placed at the ultrasonic frequencies.

The audible frequency range means the frequency range between 20 Hz and 20 kHz in the present context. The first noise transfer function exhibits the high pass response at least a portion of audible frequency range which portion may be a frequency range from 50 Hz or 200 Hz to 20 kHz. The portion of the audible frequency range may alternatively be 20 Hz to 10 kHz. The skilled person will appreciate that the high pass response of the first noise transfer function may extend to frequencies above 20 kHz as well.

The capability of the present transducer amplification circuit to simultaneously processing both the audible frequency components and ultrasonic frequency components of the transducer signal through appropriately adapted first and second sigma-delta modulators, respectively, has numerous applications to improve the user interface of portable communication and computing devices. One exemplary application is to provide ultrasonic based detection of a position of a pen on a display surface of a portable communication and computing device via ultrasonic triangulation. Commonly used microphone devices such as MEMS capacitive microphones are responsive not only to audible sound, but also to ultrasound signals in the frequency range above 20 kHz and up to about 100 kHz due to their miniscule dimensions. The user interface of such portable communication devices typically includes a touch sensitive screen or display which the user exploits to operate the communication device and access various telecommunication services like phone calls, email or SMS message writing etc. The plurality of microphones may be distributed around a periphery of the touch sensitive screen. The user may operate the communication device by an ultrasound emitting pen or pin which is used to select the relevant user interface buttons or boxes displayed on the touch sensitive screen or display. The position of the pen or pin during operation of the communication device may therefore be detected by triangulation methods based on arrival time differences of the emitted ultrasonic signal at the plurality of microphones.

The transducer signal may accordingly be generated by one of the above mentioned microphone devices. The MEMS capacitive microphone may comprise a micro-electromechanical (MEMS) transducer element, e.g. shaped and sized for portable audio devices such as smartphones, tablets and mobile phones etc. The electromechanical (MEMS) transducer element may function as a single element audio and ultrasonic microphone responsive to both impinging audible sound and ultrasonic sound due to its broad-band frequency response.

The preamplifier circuit may comprise a single preamplifier with its output coupled in parallel to respective inputs of the first and second sigma-delta modulators or two separate preamplifiers with outputs coupled to the respective inputs of the first and second sigma-delta modulators. The latter embodiment of the preamplifier circuit comprises a first preamplifier having an input coupled to the transducer signal and an output coupled to the first sigma-delta modulator; and a second preamplifier having an input coupled to the transducer signal and an output coupled to the second sigma-delta modulator. The use of single preamplifier may be advantageous because this feature minimizes semiconductor area consumption and power consumption of the preamplifier circuit. Minimal power consumption and minimal costs are typically key performance metrics of transducer amplification circuits targeted for portable communication devices. The preamplifier or preamplifiers may possess various circuit topologies known in the art. The preamplifier or each of the first and second preamplifiers may comprise a high-pass filter. In a number of useful embodiments, the preamplifier or each of the first and second preamplifiers comprises a differential amplifier having a non-inverting input operating as the signal input for receipt of the transducer signal. A feedback network may be coupled between an output and an inverting input of the preamplifier or between an output of the preamplifier and an inverting input of the preamplifier. This preamplifier topology is capable of providing large input impedance at the non-inverting input coupled to the transducer signal by isolating the feedback network there from. In an even further advantageous embodiment, the feedback network establishes a lowpass transfer function from the output of the differential amplifier to the inverting input of the preamplifier. This may be accomplished by selecting a suitable configuration of capacitors and resistive components in the feedback network. Consequently, a high-pass small signal transfer function which is useful for attenuating subsonic and/or low-frequency noise of the transducer signal and for suppression of DC offsets at the input of the preamplifier. The input impedance at the signal input of the preamplifier or signal input of each of the first and second preamplifiers is preferably very large to minimize attenuation of the transducer signal caused by loading of the transducer. This is particularly advantageous if the transducer comprises the above-discussed MEMS capacitive microphone which often exhibits large generator impedance, e.g. an impedance essentially corresponding to a capacitance of 1.0-2.0 pF. The input impedance of the preamplifier or each of the first and second preamplifiers may for example be larger than 100 MΩ, preferably larger than 1 GΩ, even more preferably larger than 10 GΩ measured at 1 kHz. Such input impedances can for example be accomplished by an appropriate choice of semiconductor process technology, such as MOS, CMOS or BiCMOS technology, and/or appropriate circuit design techniques.

The second noise transfer function may have a band-reject response with a magnitude minimum placed between 20 kHz and 200 kHz such as between 40 kHz and 100 kHz. The signal transfer function (STF) of the second sigma-delta modulator may exhibit a bandpass response having unity magnitude at the magnitude minimum of the band-reject response.

The first sigma-delta modulator may comprise various types of loop filters and filter orders to produce the high pass response of the first NTF in at least the portion of the audible frequency range. The high pass response of the first NFT may have an order between 2 and 8. The loop filter may comprise a number of integrators which corresponds to the order of the high pass response, e.g. between two and eight integrators. The skilled person will understand that the high pass response in the audible frequency range of the first noise transfer function also includes NTFs with one or more zeroes placed in the least portion of audible frequency range. These zeroes may create certain desirable minima in a quantization noise floor of the first digital transducer signal despite the first NTF exhibits an overall high pass response throughout the least portion of audible frequency range.

The first sigma-delta modulator may have a signal transfer function (STF) with substantially constant magnitude across the audible frequency range for example substantially unity magnitude.

Each of the first and second sigma-delta modulators may comprise a single-bit quantizer or a multi-bit quantizer with their respective well-known advantages and disadvantages. If each of the first and second sigma-delta modulators comprises the single-bit or one bit quantizer the first and second digital signals may be conveniently supplied as first and second PDM signals, respectively. Alternatively, each of the first and second digital signals may be converted from native PDM format to a multi-bit or PCM format. Each of the first and second sigma-delta modulators preferably operates at an oversampled sampling frequency such as a sampling frequency between 1 MHz and 10 MHz.

The transducer amplification circuit may comprise a signal coder configured to encode and format the first and second digital transducer signals to facilitate transmission of these to an external processor or component such as an application processor or DSP of the portable communication device via a suitable data channel, e.g. a serial data channel. One embodiment of the signal coder is configured to encode and format the first and second digital transducer signals into a single pulse density modulated (PDM) encoded data stream wherein the first digital transducer signal is coded on a rising or falling edge of the single PDM data stream and the second digital transducer signal is encoded on the opposite edge of the PDM single data stream. This single PDM encoded data stream allows both of the first and second digital transducer signals to be transmitted over a single data wire or connection between the transducer amplification circuit and a suitable data port of the external processor.

An alternative embodiment of the signal coder is configured to encode and format the first and second digital transducer signals into a data stream in accordance with a predetermined data transmission protocol compliant with at least one of:
a standardized data communication protocol such as I²C, USB or SPI; and
a standardized digital audio protocol such as I²S, S/PDIF, AES/EBU, SLIMbus™.
The use of the standardized data communication protocol or digital audio protocol may simply data interface handling by exploiting existing data port hardware and existing interface software and firmware components or routines of the external processor.

The data stream may in both instances be delivered by the signal coder via an externally accessible output terminal of the transducer amplification circuit.

The signal coder of the transducer amplification circuit may comprise a frequency transposing circuit, such as a digital down-converter (DDC), which is configured to transpose or down-shift the ultrasonic frequency components of the second digital transducer signal to the audible frequency range. This feature allows the ultrasonic frequency components of the second digital transducer signal to be accurately represented or encoded in a data stream conforming to a standardized digital audio protocol, such as one of the protocols discussed above, using a relatively modest sampling frequency, i.e. a sampling frequency below the Nyquist frequency of the ultrasonic frequency components in question. Hence, these ultrasonic frequency components of the second digital transducer signal may be encoded within an I²S formatted or compliant data stream with a sampling frequency of 32 kHz or of 48 KHz despite the ultrasonic frequency components are situated above 16 kHz or 24 kHz before the down-conversion. The ultrasonic frequency components may for example be situated at about 40 kHz which cannot be represented with a sampling frequency of 32 kHz or 48 KHz.

The digital down-converter may comprise a digital multiplier configured to multiply the second digital transducer signal with a predetermined binary sequence having a predetermined sequence frequency or carrier frequency to produce an intermediate digital transducer signal;
a lowpass filter configured to suppress ultrasonic frequency components of the intermediate digital transducer signal to produce one channel of the digital audio stream. A frequency difference between the predetermined sequence frequency and the ultrasonic frequency component is preferably equal to or smaller than 20 kHz.

In some embodiments, the predetermined sequence frequency is placed at one-half of the sampling frequency of the second digital transducer signal as supplied at the output of the second sigma-delta converter.

One embodiment of the transducer amplification circuit comprises a clock input terminal for receipt of an external clock signal. The respective sampling frequencies of the first and second sigma-delta converters may be controlled by and synchronized to this external clock signal. Likewise, the data stream delivered by the transducer amplification circuit may be synchronized to this external clock signal. The external clock signal may be generated by the application processor of the portable communication device to allow the application processor to act as a master for the transmission of data between the transducer amplification circuit and a suitable data port of the application processor.

A second aspect of the invention relates to a semiconductor die or substrate comprising a transducer amplification circuit according to any of the above described embodiments thereof.

A third aspect of the invention relates to a transducer assembly comprising:
a single element audio and ultrasonic microphone responsive to impinging audio and ultrasonic sound to generate a corresponding transducer signal comprising an audio signal component and an ultrasonic signal component. The transducer signal is applied to an output signal pad of the single element microphone. The transducer assembly further comprises a transducer amplification circuit according to any of the above described embodiments thereof operatively coupled to the output signal pad for receipt and amplification or buffering of the transducer signal. The single element audio and ultrasonic microphone may comprise the previously discussed micro-electromechanical (MEMS) transducer element.

The skilled person will understand that the transducer assembly may be used to provide the previously discussed ultrasound based detection of the pen position on the display surface of the portable communication and computing device via ultrasonic triangulation. The transducer assembly may be enclosed by a transducer housing which comprises a sound inlet or sound port. The transducer assembly further comprises a sound transmission path extending between the sound port and the single element audio and ultrasonic microphone.

A third aspect of the invention relates to a portable communication device which comprises a housing and a display mounted in the housing. The display is configured for providing a graphical user interface controlling a plurality of functions of the portable communication device. The portable communication device further comprises a plurality of the transducer assemblies according to any of the above described embodiments thereof mounted around a peripheral edge of the display such as on housing portion abutting the display. The portable communication device comprises an application processor, e.g. a Digital Signal Processor, as discussed above, comprising a data communication interface or interfaces for receipt of a plurality of data stream generated by the plurality of transducer assemblies.

BRIEF DESCRIPTION OF THE DRAWINGS

Embodiments of the invention are described in more detail in connection with the appended drawings in which.

DESCRIPTION OF PREFERRED EMBODIMENTS

Figure 1:
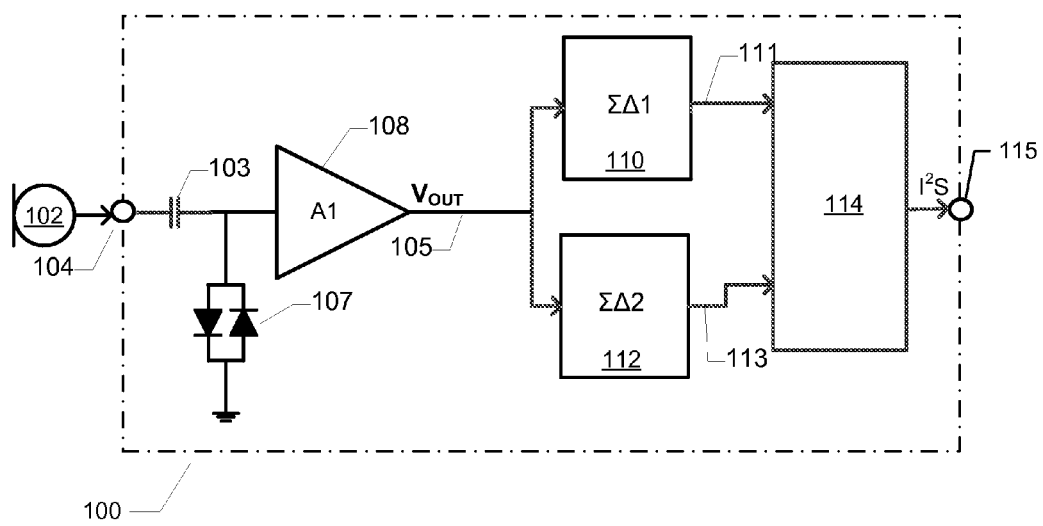
FIG. 1 shows a schematic block diagram of a transducer amplification circuit in accordance with a first embodiment of the invention.

FIG. 1 is a schematic block diagram of a transducer amplification circuit 100 electrically connected to a MEMS microphone 102 via an input pad or terminal 104 of the circuit 100. The MEMS microphone has a frequency response that extends from the audible frequency range (20 Hz-20 kHz) to ultrasonic frequencies for example from 20 Hz to above 50 kHz such as to 100 KHz. The transducer amplification circuit 100 comprises a preamplifier A1 (108) with a preamplifier input coupled to the input terminal or pad 104 of the amplification circuit 100 through a DC blocking or ac coupling capacitor 103 for receipt of a microphone signal produced by the MEMS microphone 102. This microphone signal may comprise a mixture of audible frequency components and ultrasonic frequency components. The audible frequency components may comprise speech or music while the ultrasonic frequency components may origin from an ultrasonic sound emitter (not shown) for example mounted in a pen of the portable communication or computing device.

The transducer amplification circuit 100 may serve as a front-end for a subsequent and separate signal encoder 114 or the signal encoder may be integrated together with the transducer amplification circuit 100 on a common semiconductor die as schematically indicated on the block diagram of FIG. 1. The transducer amplification circuit 100 may either be fabricated or implemented on separate CMOS semiconductor die or it may be fabricated on a CMOS semiconductor die together with a subsequent signal processing circuit. A separate digital signal processing circuit may reside remotely for example within the portable communication device or terminal in form of an appropriately programmed or configured Digital Signal Processor (DSP) with data interface terminal(s) operatively coupled to the illustrated externally accessible output terminal 115 of the present transducer amplification circuit 100. Hence, a digital audio stream produced by the transducer amplification circuit 100 may be transmitted to the external DSP via a suitable data communication interface. The transducer amplification circuit 100 may be shaped and sized for integration into a miniature MEMS microphone housing or package.

The preamplifier circuit A1 receives the microphone signal as discussed above and provides an amplified microphone signal $V_{OUT}$ comprising the previously discussed audible frequency components and ultrasonic frequency components of the microphone signal. The transducer amplification circuit 100 also comprises a pair of anti-parallel bias diodes 107 coupled between the input terminal of the preamplifier 108 and GND to set an appropriate DC bias point of the preamplifier 108. The pair of anti-parallel bias diodes 107 functions as an extremely high impedance bias circuit with an impedance of 10 GΩ or larger under small signal operation of the preamplifier 108. The extremely high impedance minimizes loading on the signal input terminal 105 and therefore maximizes the level of the audio input signal delivered by a capacitive microphone transducer element of the MEMS microphone 102. In addition the pair of anti-parallel bias diodes 107 functions as overload protection or signal limiting for the input of the preamplifier A1 by limiting a peak signal input voltage to about +/−0.5 Volt which corresponds to one diode voltage drop over a single forward diode of the pair of anti-parallel bias diodes.

The transducer amplification circuit 100 comprises a first sigma-delta modulator 110 and a second sigma-delta modulator 112 which both are coupled to the output of the preamplifier A1. The first and second sigma-delta modulators 110, 112 have different noise transfer function (NTFs) with noise spectra optimized to the particular frequency content of the microphone signal they are intended to process. The first sigma-delta modulator 110 is configured to sample and quantize the amplified microphone signal $V_{OUT}$ to generate a first digital microphone signal 111 at a first input of the signal encoder 114. The second sigma-delta modulator 112 is configured to sample and quantize the amplified microphone signal $V_{OUT}$ to generate a second digital microphone signal 113 at a second input of the signal encoder 114. Each of the first and second sigma-delta modulators 110, 112 are oversampled converters operating at an oversampled sampling rate or frequency which may lie between 2.4 MHz and 10 MHz. The skilled person will appreciate that each of the first and second sigma-delta modulators 110, 112 may comprise a single-bit quantizer or a multi-bit quantizer.

The first sigma-delta modulator 110 has a noise transfer function (NTF) with a high pass response in an audible frequency range, e.g. from 20 Hz to 20 kHz, to push quantization noise in the first digital microphone signal 111 from the audible frequency range to ultrasonic frequencies above 20 KHz. Hence, the audible frequency components of the microphone signal are represented in the first digital microphone signal 111 with a high signal-to-noise ratio. The second sigma-delta modulator 112 has a noise transfer function (NTF) with a frequency response with a magnitude minimum placed at the ultrasonic frequencies. This NTF may comprise a band-reject or band stop frequency response with the magnitude minimum placed at a particular ultrasonic frequency or frequency band where the ultrasonic frequency components emitted by the previously discussed ultrasonic emitter are located. Hence, the second digital microphone signal 112 represents the ultrasonic frequency components with a high signal-to-noise ratio to improve the accuracy of any subsequent signal processing thereof for example the previously discussed triangulation methodology to detect the pen position at the surface of the display.

The noise transfer function (NTF) of the second sigma-delta modulator 112 may push the quantization noise to the audible frequency range below 20 KHz and/or push the quantization noise to ultrasonic frequencies outside the above-mentioned ultrasonic frequency or frequency band where the target ultrasonic frequency components are located.

The signal coder or encoder 114 is configured to process and encode and format the first and second digital microphone signals 112, 114 to generate a serial digital audio stream at a predetermined sample rate. The digital audio stream is provided on the externally accessible terminal 115 of the transducer amplification circuit 100. The skilled person will understand that the serial digital audio stream may be unformatted, e.g. a double-edge modulated PDM stream, or the serial stream may be formatted in accordance with standardized data communication protocol or a standardized digital audio protocol. The standardized data communication protocol may be one of $I^2C$, USB or SPI and the standardized digital audio protocol may be one of $I^2S$, S/PDIF, AES/EBU, SLIMbus™ etc. In yet another embodiment the digital audio stream may be formatted according to a proprietary digital audio protocol for example a serial protocol. The operation of the signal coder or encoder 114 is explained in further detail below with reference to the detailed block diagram of FIG. 3.

Figure 2:
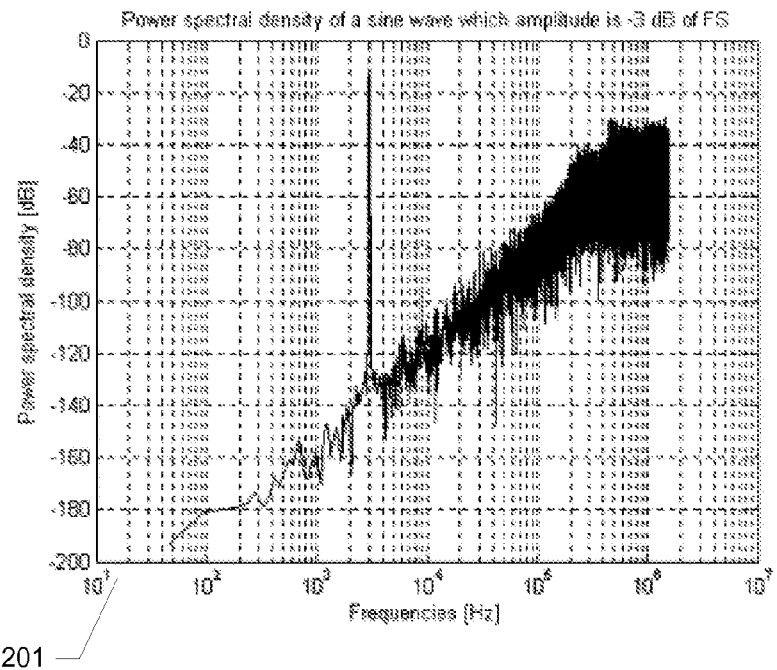
FIG. 2 shows output frequency spectra of first and second sigma-delta modulators of the transducer amplification circuit.
Figure 2:
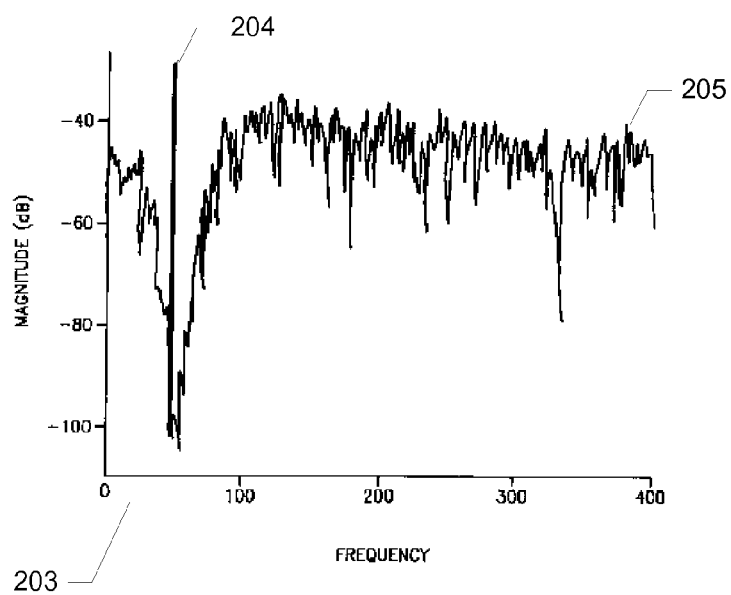

The upper graph 201 of FIG. 2 shows an exemplary frequency spectrum at the output of first sigma-delta modulator 110, i.e. the frequency spectrum of the first digital microphone signal 111 when the microphone signal is a 3 kHz sine wave with a level of −3 dB relative to full scale input of the first sigma-delta modulator 110. The pronounced high pass character of the quantization noise spectrum is evident throughout the audible frequency range from below 100 Hz to 20 kHz and above.

The lower graph 203 of FIG. 2 shows an exemplary frequency spectrum 205 at the output of second sigma-delta modulator 112, i.e. the frequency spectrum of the second digital microphone signal 113 when the microphone signal comprises an ultrasonic sine wave with a frequency of about 40 kHz. The pronounced band stop or band reject response or character of the quantization noise spectrum in the ultrasonic frequency range is evident. The quantization noise spectrum exhibits a minimum magnitude in a frequency band centred around 40 KHz where the ultrasonic sine wave 204 is located.

Figure 3:
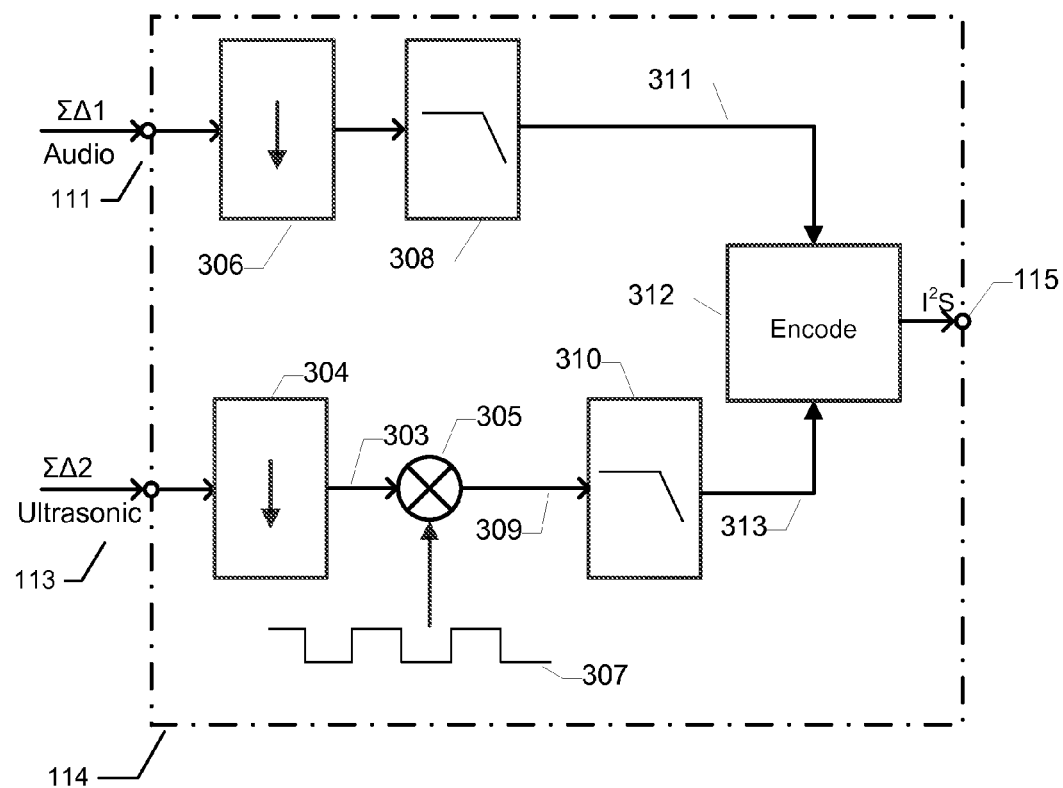
FIG. 3 shows a schematic block diagram of an exemplary signal encoder for the transducer amplification circuit of FIG. 1.

FIG. 3 shows a schematic block diagram of an exemplary signal encoder 114 for the transducer amplification circuit of FIG. 1. The signal encoder 114 comprises a first signal channel for processing of the first digital microphone signal 111 which handles the audible frequency components of the microphone signal. A second signal channel of the signal encoder 114 is configured for processing of the second digital microphone signal 113 which handles the ultrasonic frequency components of the microphone signal. The first signal channel comprises a decimator 306 which receives the first digital microphone signal 111 at the oversampled rate provided by the first sigma-delta modulator 110. The decimator 306 preferably comprises a single stage or multi-stage decimator that reduces the sample rate of the first digital microphone signal 111 with a predetermined factor such as a factor between 16 and 128 depending on the actual sample rate of the first digital microphone signal 111 and a desired final sample rate for the outgoing digital audio stream at the output terminal 115. The decimator 306 preferably comprises a lowpass filter 308 which may be a separate device or integrated with the decimator. The lowpass filter 308 may have a suitable cut-off frequency to suppress or attenuate the ultrasonic frequency competent of the first digital microphone signal 111 for example located between 16 kHz and 20 kHz. The final sample rate of the outgoing digital audio stream may be standardized digital audio sample rate between 8 kHz and 96 kHz such as a standard sample rate of the I²S digital audio interface. The encoder 312 comprises an I²S encoder in the present embodiment. The encoder 312 accordingly formats the decimated and lowpass filtered first digital microphone signal 311 in accordance with the I²S protocol and adds the formatted digital audio signal to a first channel of the I²S formatted outgoing digital audio stream.

The second signal channel of the signal encoder 114 comprises a decimator 304 which receives the second digital microphone signal 113 at the oversampled sampling rate provided by the second sigma-delta modulator 112. The sampling frequency of the second sigma-delta modulator 112 may be identical to or differ from the sampling frequency of the first sigma-delta modulator 112. The decimator 304 may form part of the second sigma-delta modulator 112 and comprise a single stage or multi-stage decimator that reduces the sample frequency of the second digital microphone signal 113 with a predetermined factor such as a factor between 16 and 128, depending on the actual sampling frequency of the second digital microphone signal 111, to produce the decimated second digital microphone signal 303. The sampling frequency of the decimated second digital microphone signal 303 may be higher than the sampling frequency of the decimated first digital microphone signal 311 because the former digital microphone signal 303 is capable of representing the ultrasonic frequency components of the microphone signal. This ultrasonic frequency component may for example lie between 20 kHz and 100 kHz for example at 40 kHz as discussed above. The sampling frequency of the decimated second digital microphone signal 303 may therefore lie at, or preferably above, the Nyquist frequency of the ultrasonic frequency component in question. Hence, the sampling frequency of the decimated second digital microphone signal 303 may be set to e.g. 96 kHz if the ultrasonic frequency component is at 40 kHz. The skilled person will understand that the frequency content of the ultrasonic frequency component may be impossible to reproduce in a digital audio stream at any of the previously discussed relatively low standard sampling frequencies of the I²S protocol like 32, 44.1 or 48 kHz.

This problem has been addressed and solved in the present embodiment of the signal encoder 114 by a digital down-converter (DDC) 305. The DCC 305 multiplies the intermediate digital microphone signal 303 with a square wave 307 having a predetermined carrier frequency/sequence frequency to transpose or down-shift the ultrasonic frequency components to the audible frequency range in intermediate digital transducer signal 309 produced at the output of DCC 305. Hence, allowing the ultrasonic frequency component to be accurately represented in the second channel of the I²S formatted outgoing digital audio stream on terminal 115 despite its low standard audio sampling rate of e.g. 44.1 KHz. In one exemplary embodiment, the ultrasonic frequency component may be situated at 40 kHz and the carrier frequency at 50 KHz such that the ultrasonic frequency component is transposed to the 10 kHz difference frequency in the intermediate digital transducer signal 309. In some embodiments, the carrier frequency is placed at one-half of the sampling frequency of the intermediate digital microphone signal 303, e.g. 48 kHz in the present embodiment. In addition to the desired difference frequency component at 10 kHz (for a 50 kHz carrier frequency), the intermediate digital transducer signal 309 comprises numerous unwanted ultrasonic frequency components situated at various sum frequencies of the 40 kHz ultrasonic frequency component and the 50 KHz carrier frequency. However, these unwanted ultrasonic frequency components are attenuated by passing the intermediate digital transducer signal 309 through a combined lowpass filter and decimator 310 to produce the second digital microphone signal 313 at a sampling frequency compatible with the selected I²S sampling frequency of the encoder 312. The cut-off frequency of the lowpass filter and decimator 310 may for example be set to about 20 kHz. Hence, the second digital microphone signal 313 has been decimated and lowpass filtered such that the ultrasonic frequency components of the microphone signal are accurately represented at the selected standard sampling frequency of the I²S protocol like 32, 44.1 or 48 kHz. The second digital microphone signal 313 is therefore applied to the second input of the I²S encoder 312. Finally, the I²S encoder 312 formats the decimated and down converted second digital microphone signal 313 in accordance with the I²S protocol and adds this formatted digital audio signal to a second and vacant channel of the I²S formatted outgoing digital audio stream.

The invention claimed is:

1. A circuit system, comprising:
an amplifier;
a pair of sigma delta analog to digital converters (ΣΔ ADCs), including a first ΣΔ ADC and a second ΣΔ ADC, to generate a digitized amplifier signal, each having an input coupled to an output of the amplifier, each characterized by a quantization noise characteristic, wherein a quantization noise generated by the first ΣΔ ADC occurs in a first frequency band and a quantization noise generated by the second ΣΔ ADC occurs in a second frequency band different from the first; and
a signal coder having inputs coupled to outputs of the first and second ΣΔ ADCs and configured to encode a signal output from the first ΣΔ ADC and a signal output from the second ΣΔ ADC into a single encoded data stream, wherein the signal coder includes a frequency transposing circuit configured to transpose ultrasonic frequency content of the signal output from the second ΣΔ ADC to an audible frequency range.

2. The system of claim 1, wherein the quantization noise of the first ΣΔ ADC occurs in an ultrasonic frequency range and the quantization noise of the second ΣΔ ADC occurs in an audible frequency range.

3. The system of claim 2, wherein the first ΣΔ ADC has a noise transfer function (NTF) with a high pass response in at least a portion of an audible frequency range.

4. The system of claim 2, wherein the first ΣΔ ADC has a signal transfer function (STF) with substantially constant magnitude across the audible frequency range.

5. The system of claim 1, wherein the second ΣΔ ADC has a noise transfer function (NTF) with a magnitude minimum in the ultrasonic frequency range.

6. The system of claim 1, wherein the amplifier consists of a first amplifier having an output coupled to the input of the first ΣΔ ADC, and a second amplifier coupled to the input of the second ΣΔ ADC.

7. The system of claim 1, wherein the second ΣΔ ADC has a noise transfer function and wherein the noise transfer function of the second ΣΔ ADC has a band-reject response with a magnitude minimum placed between 20 kHz and 200 kHz.

8. The system of claim 7, wherein the second ΣΔ ADC has a signal transfer function (STF) with a bandpass response having unity magnitude at frequencies where the magnitude minimum is placed in the band-reject response.

9. The system of claim 1, wherein each of the first and second ΣΔ ADC comprises a one-bit quantizer.

10. The system of claim 1, wherein the signal coder is a pulse density modulator whose output encodes an output by the first ΣΔ ADC on a first edge of the modulator output and an output by the second ΣΔ ADC on a second edge of the modulator output.

11. The system of claim 1, further comprising a microphone having an output coupled to an input of the amplifier.

12. A circuit system, comprising:
an amplifier system having a pair of amplifiers, each coupled to a common input;
a pair of sigma delta analog to digital converters (ΣΔ ADCs), a first ΣΔ ADC having an input coupled to an output of the first amplifier and a second ΣΔ ADC having an input coupled to an output of the second amplifier, each ΣΔ ADC characterized by a quantization noise characteristic, wherein a quantization noise generated by the first ΣΔ ADC occurs in a first frequency band and a quantization noise generated by the second ΣΔ ADC occurs in a second frequency band different from the first; and
a signal coder having inputs coupled to outputs of the first and second ΣΔ ADCs and configured to encode a signal output from the first ΣΔ ADC and a signal output from the second ΣΔ ADC into a single encoded data stream, wherein the signal coder includes a frequency transposing circuit configured to transpose ultrasonic frequency content of the signal output from the second ΣΔ ADC to an audible frequency range.

13. The system of claim 12, wherein the quantization noise of the first ΣΔ ADC occurs in an ultrasonic frequency range and the quantization noise of the second ΣΔ ADC occurs in an audible frequency range.

14. The system of claim 12, wherein each of the first and second ΣΔ ADC comprises a one-bit quantizer.

15. The system of claim 12, wherein the signal coder is a pulse density modulator whose output encodes an output by the first ΣΔ ADC on a first edge of the modulator output and an output by the second ΣΔ ADC on a second edge of the modulator output.

16. A method comprising:
amplifying a received transducer signal;
quantizing, using a pair of ΣΔ ADCs including a first ΣΔ ADC and a second ΣΔ ADC, the amplified transducer signal to generate respective quantized transducer signals, wherein a quantization noise of the first ΣΔ ADC occurs in a first frequency band and a quantization noise of the second ΣΔ ADC occurs in a second frequency band different from the first; and
encoding a quantized transducer signal from the first ΣΔ ADC and a quantized transducer signal from the second ΣΔ ADC into a single encoded data stream, wherein the quantization noise of the first ΣΔ ADC occurs in an ultrasonic frequency range and the quantization noise of the second ΣΔ ADC occurs in an audible frequency range, and the encoding comprises shifting ultrasonic frequency components of output from the second ΣΔ ADC to the audible frequency range.

17. The method of claim 16, wherein the coding is pulse density modulation.

18. The method of claim 17, wherein an output of the first ΣΔ ADC is coded on a first type of edge of the data stream and an output of the second ΣΔ ADC is coded on an opposite type of edge of the data stream.

19. The method of claim 16, wherein the transducer signal is a microphone signal.

20. The method of claim 16, further comprising:
capturing the transducer signal by a transducer,
wherein the first frequency band is a frequency range corresponding to a capture frequency of the transducer and the second frequency band is a frequency range outside the capture frequency of the transducer.

* * * * *